(12) United States Patent
Jou et al.

(10) Patent No.: US 8,692,242 B1
(45) Date of Patent: Apr. 8, 2014

(54) CANDLELIGHT-LIKE LIGHT ORGANIC LIGHT-EMITTING DEVICE

(71) Applicant: National Tsing Hua University, Hsinchu (TW)

(72) Inventors: Jwo-Huei Jou, Hsinchu (TW); Chun-Yu Hsieh, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 13/726,302

(22) Filed: Dec. 24, 2012

(30) Foreign Application Priority Data

Nov. 13, 2012 (TW) ............................. 101142293 A

(51) Int. Cl.
*H01L 51/54* (2006.01)
(52) U.S. Cl.
USPC .................................... 257/40; 257/E51.018
(58) Field of Classification Search
USPC .......................................................... 257/40
See application file for complete search history.

(56) References Cited

U.S. PATENT DOCUMENTS

| 6,515,314 | B1 * | 2/2003 | Duggal et al. | 257/184 |
| 2010/0045175 | A1 * | 2/2010 | Mathai et al. | 313/504 |
| 2012/0175598 | A1 * | 7/2012 | Balaganesan et al. | 257/40 |
| 2012/0223295 | A1 * | 9/2012 | Inoue et al. | 257/40 |

* cited by examiner

*Primary Examiner* — Thao P Le

(57) ABSTRACT

The present invention relates to a candlelight-like light organic light-emitting device, comprising: a first conductive layer, a hole injection layer, a hole transport layer, a first host light-emitting layer, a second host light-emitting layer, an electron transport layer, an electron injection layer, and a second conductive layer. Particularly, in the present invention, a plurality of candlelight complementary color dyes are doped in the first host light-emitting layer and the second host light-emitting layer for making the first host light-emitting layer and the second host light-emitting layer respectively emit a first light and a second light, such that the first light and the second light are mixed to a candlelight-like light with high color rendering index and low color temperature; therefore the candlelight-like light is suitable for being a reading light or a bedside light, and can facilitate users to read by their eyes under a comfortable condition.

10 Claims, 15 Drawing Sheets

| Device | First host light-emitting layer | | Second host light-emitting layer | | | | CRI | Power efficiency (lm/w⁻²) | External Quantum Efficiency (%) | Color Temperature (K) |
|---|---|---|---|---|---|---|---|---|---|---|
| | Thickness (nm) | Blue dye (Wt%) | Thickness (nm) | Green dye (Wt%) | Yellow dye (Wt%) | Red dye (Wt%) | | | | |
| I-1 | 15 | 20 | 5 | 12.5 | 5 | 1 | 78 | 15.9 | 11.2 | 3000 |
| I-2 | 10 | 20 | 10 | 12.5 | 5 | 1 | 85 | 17.0 | 14.1 | 1900 |
| I-3 | 5 | 20 | 15 | 12.5 | 5 | 1 | 64 | 30.3 | 16.3 | 2361 |

FIG. 5

| Device | First host light-emitting layer | | Second host light-emitting layer | | | | Combined light-emitting layer | | CRI | Power efficiency (lm/w⁻²) | External Quantum Efficiency (%) | Color Temperature (K) |
|---|---|---|---|---|---|---|---|---|---|---|---|---|
| | Thickness (nm) | Blue dye (Wt%) | Thickness (nm) | Green dye (Wt%) | Yellow dye (Wt%) | Red dye (Wt%) | TCTA | TPBi | | | | |
| II-4 | 5 | 20 | 15 | 12.5 | 3 | 1 | 3 | 1 | 93 | 19.2 | 14.6 | 2150 |
| II-7 | 5 | 20 | 15 | 12.5 | 3 | 1 | 1 | 1 | 89 | 16.0 | 11.6 | 2710 |
| II-8 | 5 | 20 | 15 | 12.5 | 3 | 1 | 1 | 3 | 84 | 12.5 | 8.7 | 3371 |
| II-9 | 5 | 20 | 15 | 12.5 | 3 | 1 | 1 | - | - | 30.8 | 17.8 | - |

FIG. 12

CANDLELIGHT-LIKE LIGHT ORGANIC LIGHT-EMITTING DEVICE

BACKGROUND OF THE INVENTION

1. Field of the Invention

The present invention relates to an organic light-emitting diode (OLED), and more particularly to a candlelight-like light organic light-emitting device with high efficiency, high color rendering index (CRI) and low color temperature (CT).

2. Description of the Prior Art

An organic light emitting diode (OLED) was invented by C. W. Tang and S. A. VanSlyk et al. of Eastman Kodak Company in 1987 and manufactured by a vacuum evaporation method. A hole transporting material and an electron transporting material (such as $Alq_3$) are respectively deposited on a transparent indium tin oxide (abbreviated as ITO) glass, and then a metal electrode is vapor-deposited thereon to form the self-luminescent OLED apparatus. Due to high brightness, fast response speed, light weight, compactness, true color, no difference in viewing angles, no need of liquid crystal display (LCD) type backlight plates as well as a saving in light sources and low power consumption, it has become a new generation display.

In addition to light-emitting material layers, the conventional OLED device is often added to other intermediate layers, such as an electron transport layer and a hole transport layer, so as to enhance the efficiency of the OLED device. Referring to FIG. 1, which is a structural drawing of a conventional OLED device. As shown in FIG. 1, the conventional OLED device 1' includes a cathode 11', an electron injection layer 12', an electron transport layer 13', a first light-emitting material layer 14', a second light-emitting material layer 15', a hole transport layer 16', a hole injection layer 17', and an anode 18'.

The above-mentioned conventional OLED device 1' is a high efficiency OLED device; however, it is a white light OLED device and merely adapted to be a lighting source. This OLED device 1' is unsuitable for being a reading light or a bedside light because the high brightness and high color temperature of the white light would induce discomfort on human eyes, and more seriously, the high brightness and high color temperature of the white light would suppress the secretion of melatonin, so as to cause human insomnia.

Accordingly, in view of the conventional OLED devices still have shortcomings and drawbacks, the inventor of the present application has made great efforts to make inventive research thereon and eventually provided a candlelight-like light organic light-emitting device.

SUMMARY OF THE INVENTION

The primary objective of the present invention is to provide a candlelight-like organic light-emitting device, in which a plurality of candlelight complementary color dyes are doped in a first host light-emitting layer and a second host light-emitting layer for making the first host light-emitting layer and the second host light-emitting layer respectively emit a first light and a second light, such that the first light and the second light are mixed to a candlelight-like light with high color rendering index and low color temperature; therefore, the candlelight-like light is suitable for being a reading light or a bedside light, and can facilitate users to read by their eyes under a comfortable condition.

Accordingly, to achieve the primary objective of the present invention, the inventor of the present invention provides a candlelight-like light organic light-emitting device, comprising:

a first conductive layer; a hole injection layer, formed on the first conductive layer; a hole transport layer, formed on the hole injection layer; a first host light-emitting layer, formed on the hole transport layer; a second host light-emitting layer, formed on the first host light-emitting layer; an electron transport layer, formed on the second host light-emitting layer; an electron injection layer, formed on the electron transport layer; and a second conductive layer, formed on the electron injection layer. Wherein a plurality of candlelight complementary color dyes are doped in the first host light-emitting layer and the second host light-emitting layer for making the first host light-emitting layer and the second host light-emitting layer respectively emit a first light and a second light, such that the first light and the second light are mixed to a candlelight-like light with high color rendering index and low color temperature.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein:

FIG. 5 is an experiment table;

FIG. 12 is an experiment table;

DETAILED DESCRIPTION OF THE PREFERRED EMBODIMENTS

To more clearly describe a candlelight-like light organic light-emitting device according to the present invention, embodiments of the present invention will be described in detail with reference to the attached drawings hereinafter.

Figure 1:
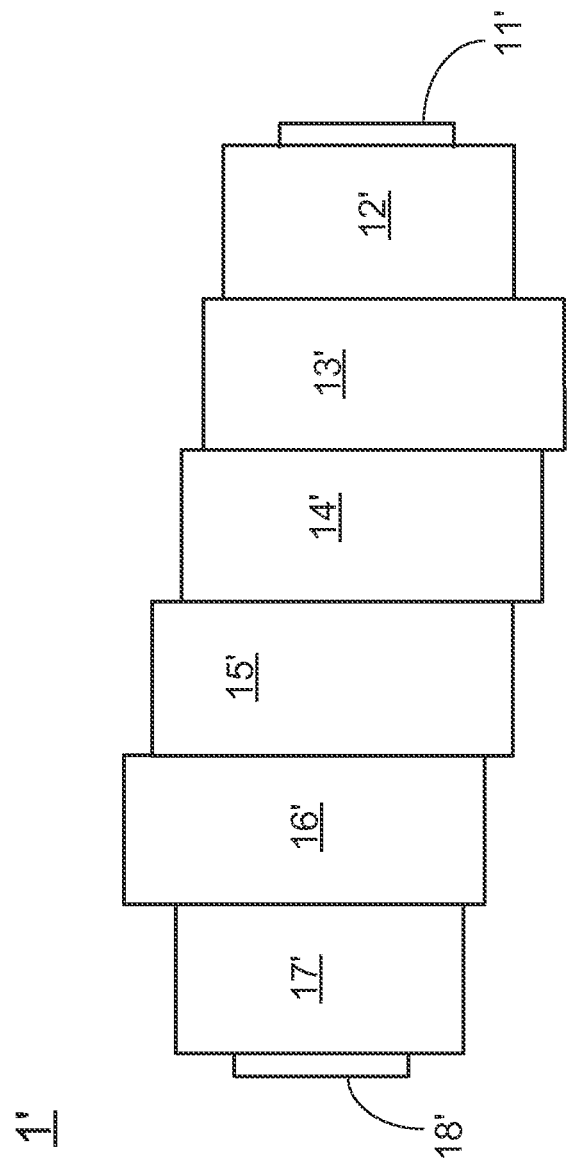
FIG. 1 is a structural drawing of a conventional OLED device.
Figure 2:
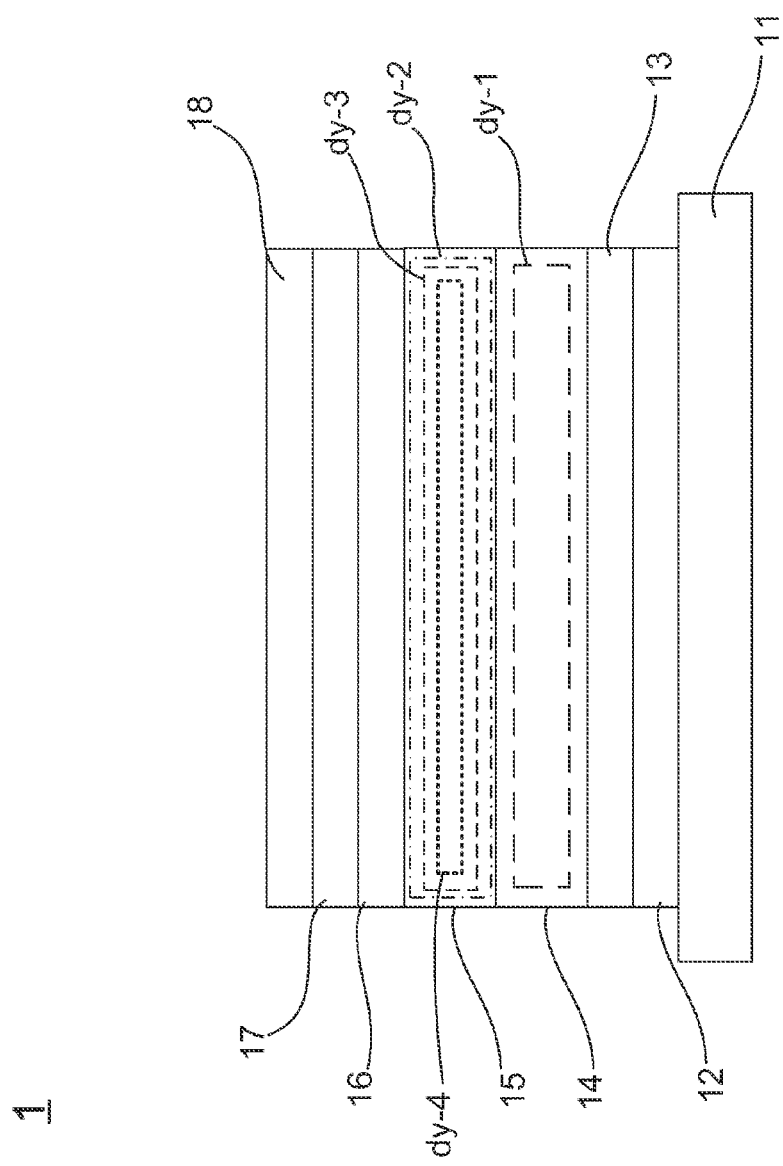
FIG. 2 is a structural drawing of a candlelight-like light organic light-emitting device according to the present invention.
Figure 3:
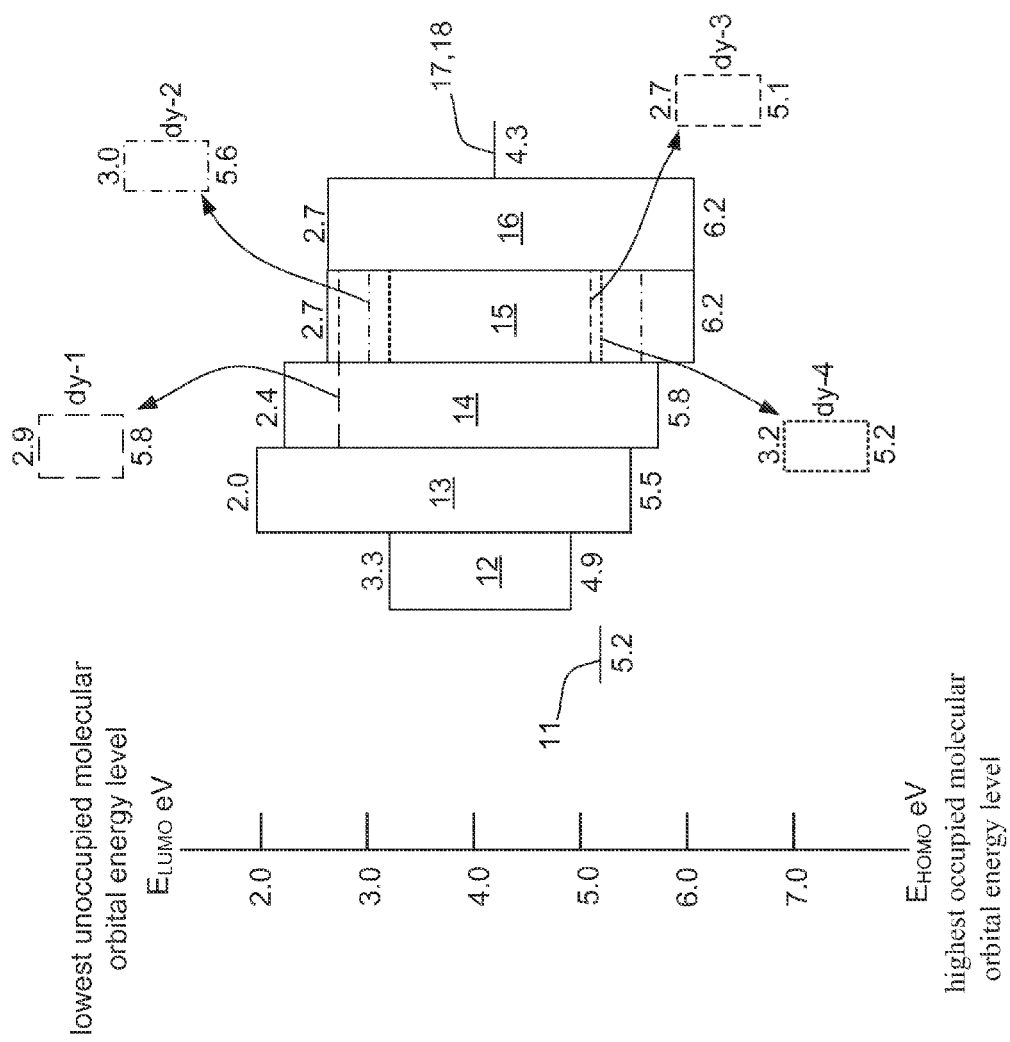
FIG. 3 is an energy band view of the candlelight-like light organic light-emitting device according to the present invention.

Please refer to FIG. 2 and FIG. 3, which respectively illustrate a structural drawing and an energy band view of a candlelight-like light organic light-emitting device according to the present invention. As shown in FIG. 2 and FIG. 3, the candlelight-like light organic light-emitting device 1 includes: a first conductive layer 11, a hole injection layer 12, a hole transport layer 13, a first host light-emitting layer 14, a second host light-emitting layer 15, an electron transport layer 16, an electron injection layer 17, and a second conductive layer 18. In the present invention, a plurality of candlelight complementary color dyes are doped in the first host light-emitting layer 14 and the second host light-emitting layer 15 for making the first host light-emitting layer 14 and the second host light-emitting layer 15 respectively emit a first light and a second light, such that the first light and the second light are mixed to a candlelight-like light with high color rendering index and low color temperature.

Figure 4:
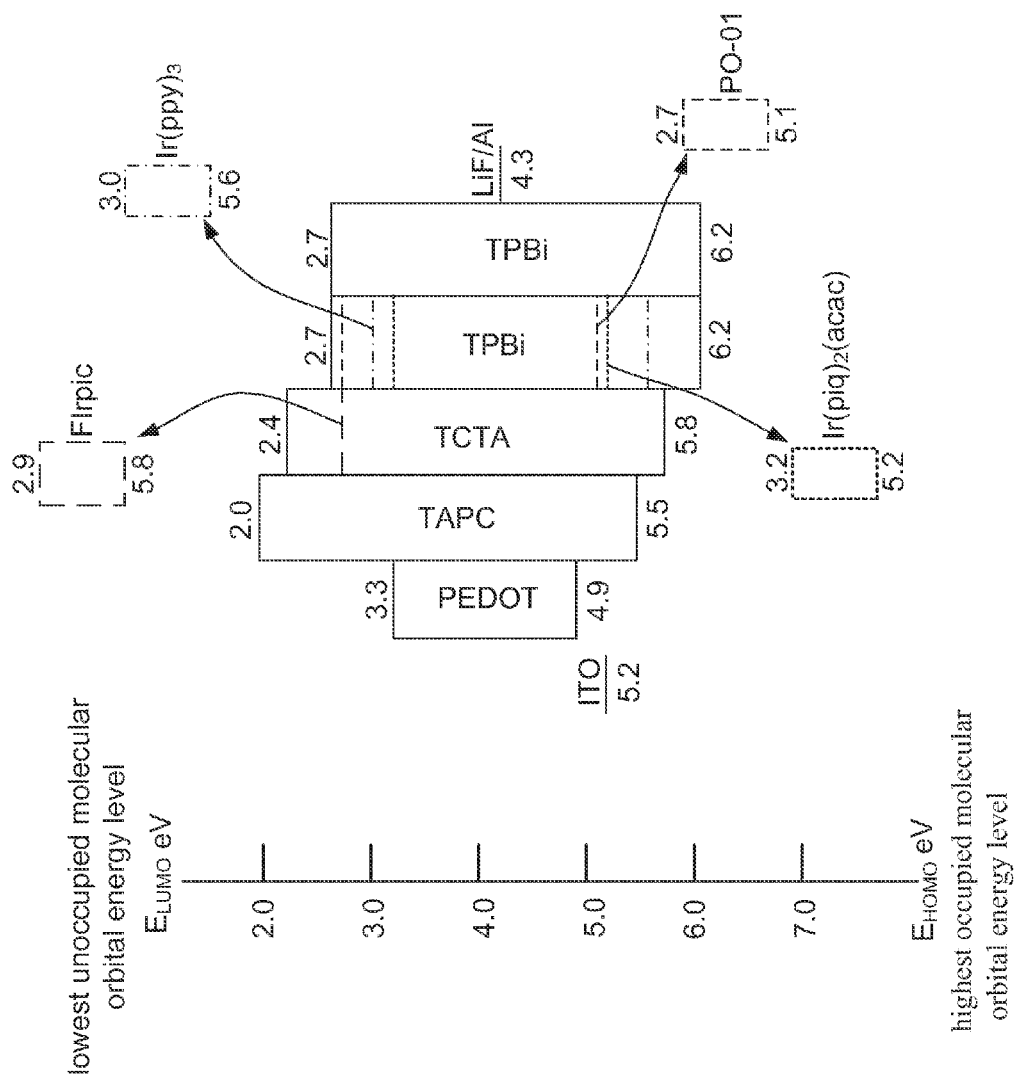
FIG. 4 is a second energy band view of the candlelight-like light organic light-emitting device according to the present invention.

Continuously referring to FIG. 2 and FIG. 3, and please simultaneously refer to FIG. 4, which illustrates a second energy band view of the candlelight-like light organic light-emitting device, The material names are marked on energy band diagram of FIG. 4 for comparison purpose, wherein the first conductive layer 11 is ITO and used for being an anode, and the second conductive layer 11 is Al and used for being an cathode.

The hole injection layer 12 is Poly-3,4-Ethylenedioxythiophene (PEDOT) and formed on the first conductive layer 11, and the hole transport layer 13 is (1,1-bis{4-[di(p-tolyl)amino]-phenyl}cyclohexane) (TAPC) and sequentially formed on the hole injection layer 12. The first host light-emitting layer 14 is 4,4',4"-Tri(9-carbazoyl)triphenylamine (TCTA) and formed on the hole transport layer 13, wherein a first dye dy-1 of the plurality of candlelight complementary color dyes is doped in the first host light-emitting layer 14. The first dye dy-1 is a blue dye of Iridium(III) bis(4,6-difluorophenylpyridinato)picolate (FIrpic), and the better weight percentage (wt %) of the first dye dy-1 in the first host light-emitting layer 14 is 20 wt %.

The second host light-emitting layer 15 is 1,3,5-Tri(1-phenyl-1H-benzo[d]imidazol-2-yl)phenyl (TPBi) and formed on the first host light-emitting layer 14, wherein a second dye dy-2, a third dye dy-3 and a fourth dye dy-4 of the plurality of candlelight complementary color dyes is doped in the second host light-emitting layer 15. The second dye dy-2, the third dye dy-3 and the fourth dye dy-4 are green dye of tris(2-phenylpyridine)iridium (Ir(ppy)$_3$), green dye of tris(2-phenylpyridine)iridium (Ir(ppy)$_3$), yellow dye of Iridium(III)bis(4-phenylthieno[3,2-c]pyridinato-N,C2') acetylacetonate (PO-01) and red dye of Bis(1-phenylisoquinoline) (acetylacetonate)iridium(III) (Ir(piq)2(acac)), respectively; moreover, the better weight percentage (wt %) of the second dye dy-2, the third dye dy-3 and the fourth dye dy-4 in the second host light-emitting layer 15 are 12.5 wt %, 5 wt % and 1 wt %.

In addition, the electron transport layer 16 is formed on the second host light-emitting layer 15, the electron injection layer 17 is sequentially formed on the electron transport layer 16, and the second conductive layer 18 is eventually formed on the electron injection layer 17. In the present invention, the materials of the electron transport layer 16 and the electron injection layer 17 are 1,3,5-tris(N-phenylbenzimidazol-2-yl)benzene (TPBi) and LiF. Herein, the work function, the lowest unoccupied molecular orbital energy level ($E_{LUMO}$) and the high occupied molecular orbital energy level ($E_{HOMO}$) are listed in the following table:

| Layer | Work function | $E_{LUMO}$ | $E_{HOMO}$ |
|---|---|---|---|
| First conductive layer (ITO) | 5.2 eV | | |
| hole injection layer (PEDOT) | | 3.3 eV | 4.9 eV |
| hole transport layer (TAPC) | | 2.0 eV | 5.5 eV |
| first host light-emitting layer (TCTA) | | 2.4 eV | 5.8 eV |
| First dye (FIrpic) | | 2.9 eV | 5.8 eV |
| Second host light-emitting layer (TPBi) | | 2.7 eV | 6.2 eV |
| Second dye (Ir(ppy)$_3$) | | 3.0 eV | 5.6 eV |
| Third dye (PO-01) | | 2.7 eV | 5.1 eV |
| Fourth dye (Ir(piq)$_2$(acac)) | | 3.2 eV | 5.2 eV |
| electron transport layer (TPBi) | | 2.7 eV | 6.2 eV |
| electron injection layer (LiF) | 4.3 eV | | |
| second conductive layer (Al) | | | |

Thus, through the descriptions, the candlelight-like light organic light-emitting device of the present invention has been completely introduced and disclosed; in which, when this candlelight-like light organic light-emitting device 1 emits, the first host light-emitting layer 14 and the second host light-emitting layer 15 would respectively emit a first light and a second light, and then the first light and the second light are mixed to a candlelight-like light with high color rendering index and low color temperature. Therefore, the candlelight-like light is suitable for being a reading light or a bedside light, and can facilitate users to read by their eyes under a comfortable condition.

Next, for proving the practicability of this candlelight-like light organic light-emitting device, experiment data will be showed in follows. Please refer to FIG. 5, there is shown an experiment table. The weight percentage of the first dye (blue dye) dy-1, the second dye (green dye) dy-2, the third dye (yellow dye) dy-3, and the fourth dye (red dye) dy-4 are respectively set to 20 wt %, 12.5 wt %, 5 wt %, and 1 wt % in the experiment table. Besides, device I-1, I-2 and I-3 are also listed in the experiment table, wherein the thickness ratio of the first host light-emitting layer 14 and the second host light-emitting layer 15 in device I-1, I-2 and I-3 are 3:1, 1:1 and 1:3, respectively.

Figure 6:
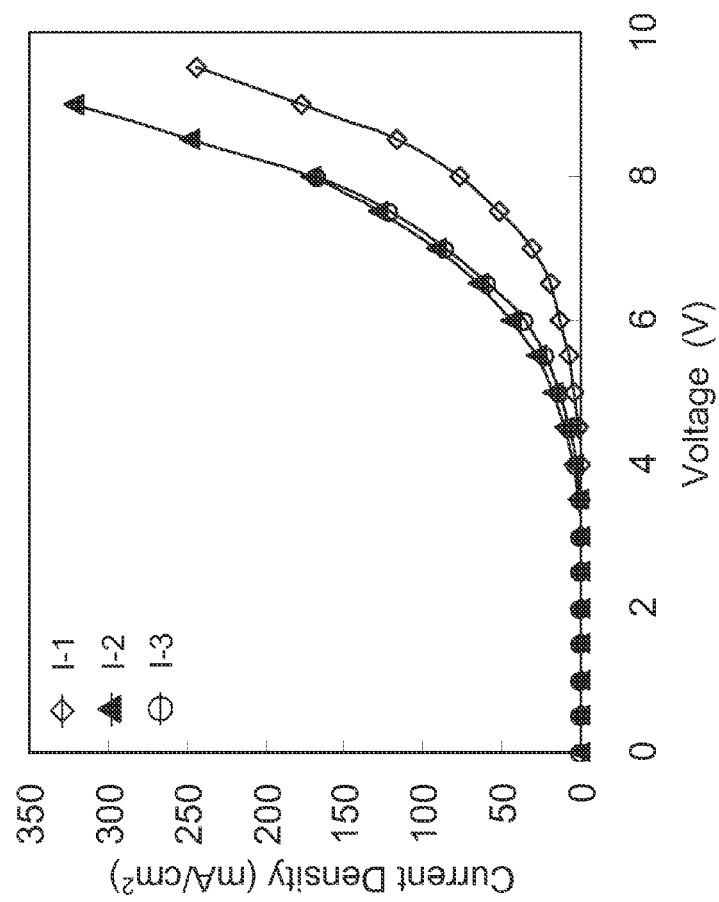
FIG. 6 is a curve plot of the current density of the candlelight-like light organic light-emitting device.
Figure 7:
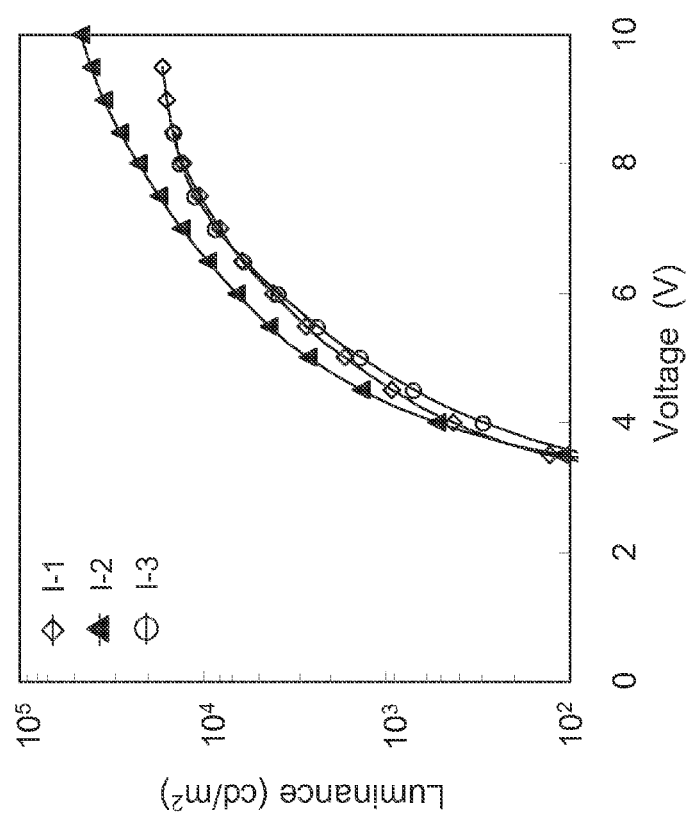
FIG. 7 is a curve plot of the luminance of the candlelight-like light organic light-emitting device.
Figure 8:
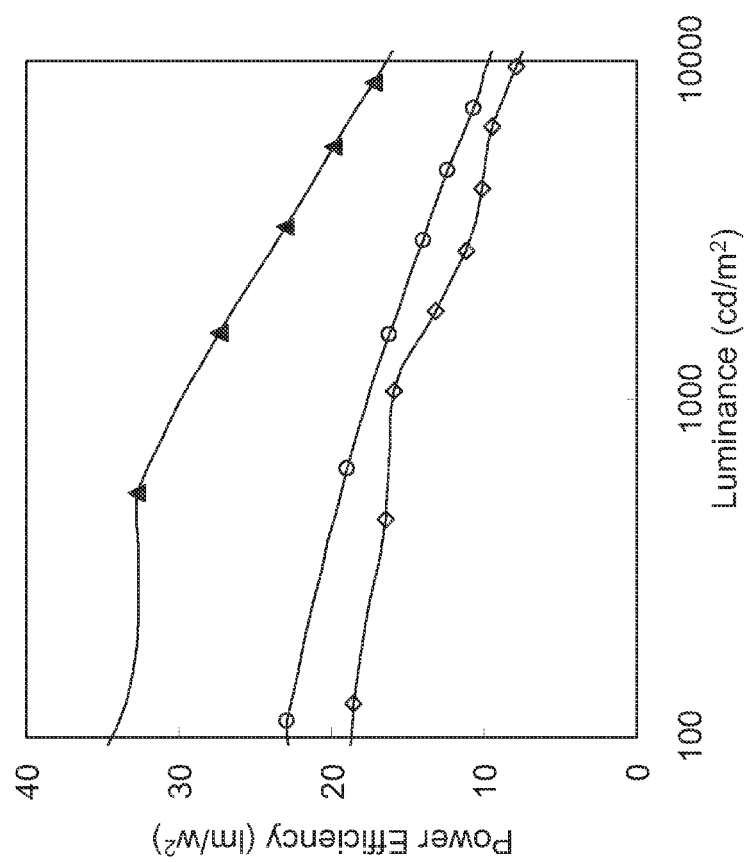
FIG. 8 is a curve plot of the power efficiency of the candlelight-like light organic light-emitting device.

Referring to FIG. 5 again, and please simultaneously refer to FIG. 6, FIG. 7 and FIG. 8, which illustrate curve plots of the current density, the luminance and the power efficiency of the candlelight-like light organic light-emitting device. As shown in FIG. 6, the data points of hollow diamond, solid triangular and hollow circular respectively represent the current density of device I-1, I-2 and I-3, wherein the current density of device I-2 and I-3 are greater than the current density of device I-1. Moreover, as shown in FIG. 7, the luminance of device I-2 is greater than the luminance of device I-1 and I-3. Furthermore, as shown in FIG. 8, the power efficiency of device I-2 is greater than the power efficiency of device I-1 and I-3. In addition, device I-2 also performs higher color rendering index (CRI=85) and lower color temperature (CT=1900K) than device I-1 and I-3.

Figure 9:
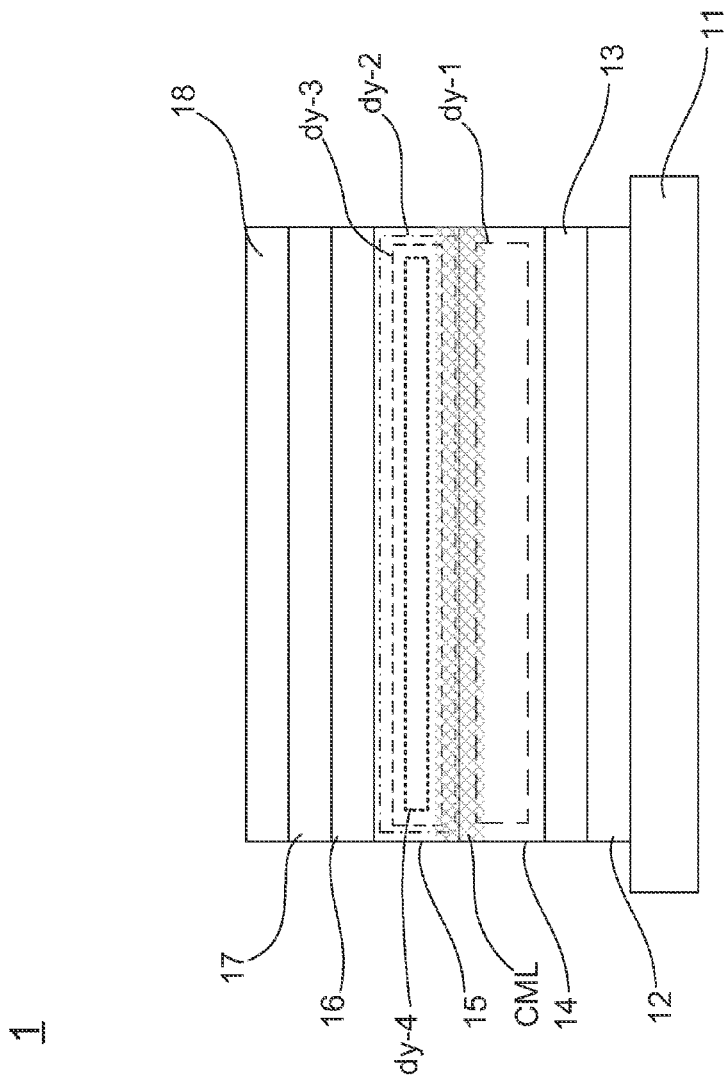
FIG. 9 is a structural drawing of a second embodiment of the candlelight-like light organic light-emitting device according to the present invention.
Figure 10:
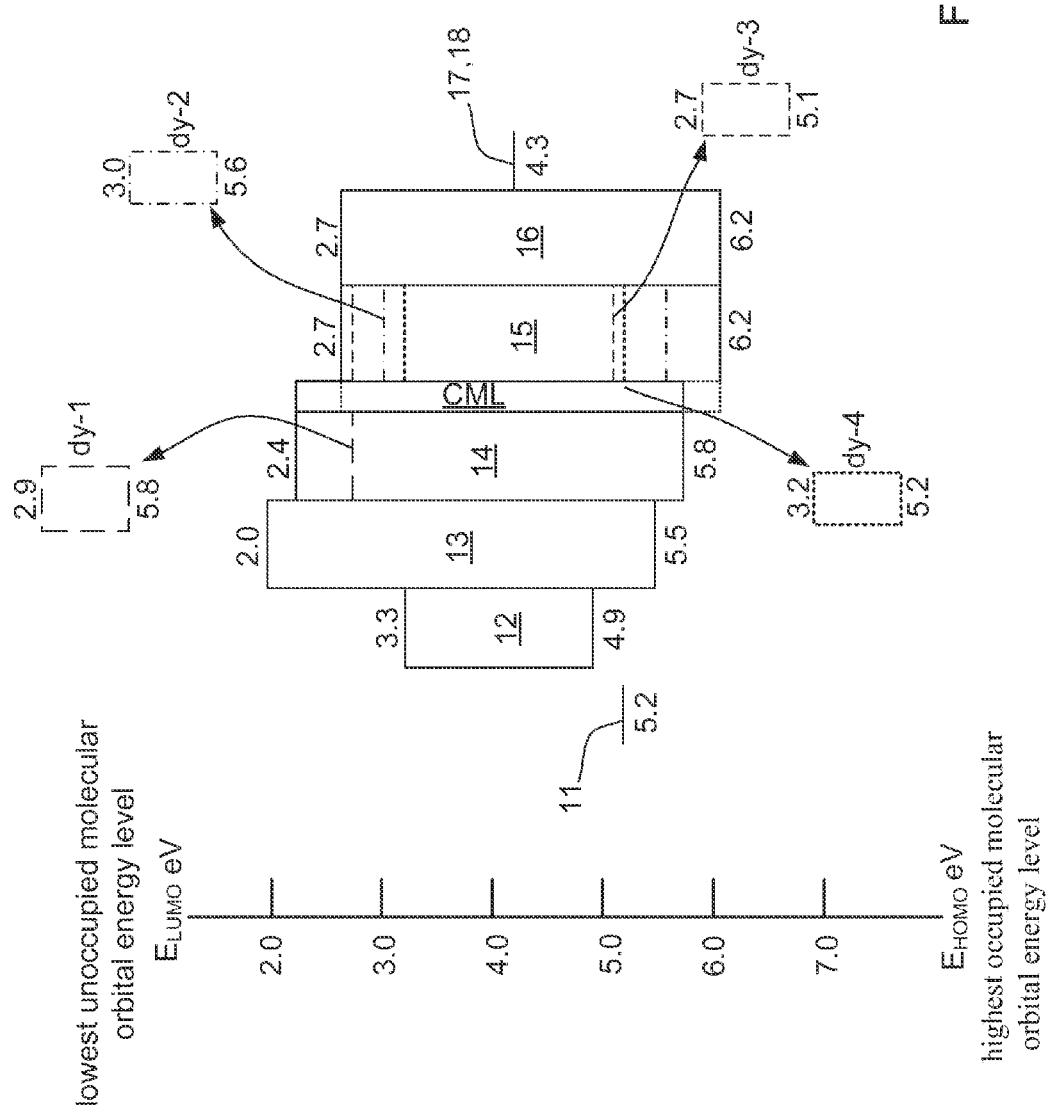
FIG. 10 is an energy band view of the second embodiment of the candlelight-like light organic light-emitting device according to the present invention.

Therefore, through the above descriptions, the practicability of the candlelight-like light organic light-emitting device has been proven. However, besides the base structure shown in FIG. 2, FIG. 3 and FIG. 4, the candlelight-like light organic light-emitting device of the present invention further has a second embodiment structure. Please refer to FIG. 9 and FIG. 10, which respectively illustrate a structural drawing and an energy band view of a second embodiment of the candlelight-like light organic light-emitting device according to the present invention. As shown in FIG. 9 and FIG. 10, the second embodiment of the candlelight-like light organic light-emitting device 1 includes: a first conductive layer 11, a hole injection layer 12, a hole transport layer 13, a first host light-emitting layer 14, a first dye dy-1, a second host light-emitting layer 15, a second dye dy-2, a third dye dy-3, a fourth dye dy-4, an electron transport layer 16, a combined carrier modulation layer (CML), an electron injection layer 17, and a second conductive layer 18. The first conductive layer 11, the hole injection layer 12, the hole transport layer 13, the first host light-emitting layer 14, the first dye dy-1, the second host light-emitting layer 15, the second dye dy-2, the third dye dy-3, the fourth dye dy-4, the electron transport layer 16, the electron injection layer 17, and the second conductive layer 18 have been introduced in above descriptions, so that their relative introductions and descriptions will not be repeated herein.

Figure 11:
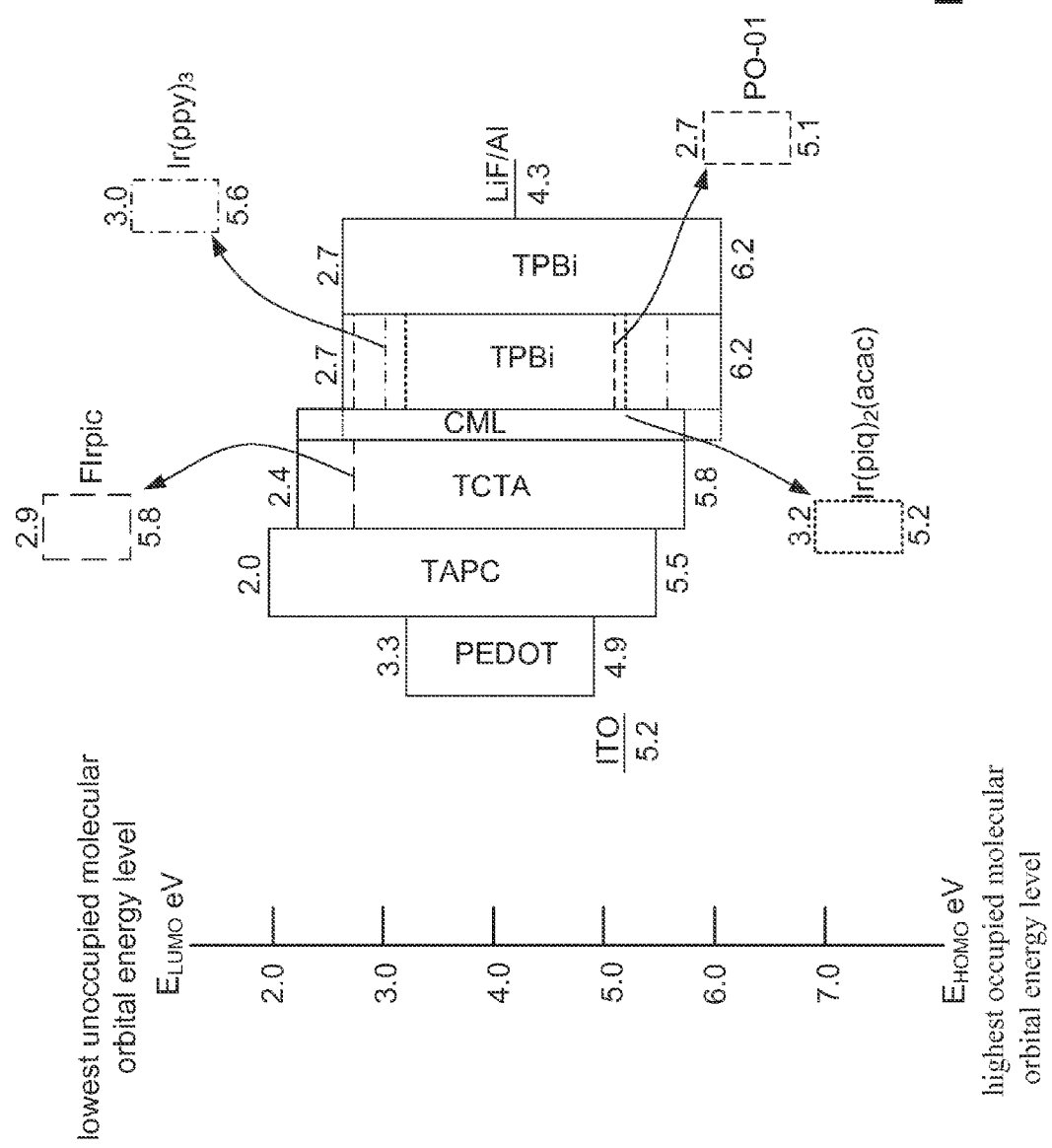
FIG. 11 is a second energy band view of the second embodiment of the candlelight-like light organic light-emitting device according to the present invention.

Continuously refer to FIG. 9 and FIG. 10, and please simultaneously refer to FIG. 11, which illustrates a second energy band view of the second embodiment of the candlelight-like light organic light-emitting device, wherein the material names are marked on energy band diagram of FIG. 11 for comparison purpose. Particularly, in the second embodiment of the candlelight-like light organic light-emitting device 1, the carrier modulation layer CML is made of the partial first host light-emitting layer 14 and the second host light-emitting layer 15, and the combining ratio of the first host light-emitting layer 14 and the second host light-emitting layer 15 is 3:1. Therefore, the second embodiment of the candlelight-like light organic light-emitting device 1 will perform higher CRI and efficiency than above-mentioned embodiment.

Next, for proving the practicability of this second embodiment of the candlelight-like light organic light-emitting device, experiment data will be showed in follows. Please refer to FIG. 12, there is shown an experiment table. The weight percentage of the first dye (blue dye) dy-1, the second dye (green dye) dy-2, the third dye (green dye) dy-3, and the fourth dye (red dye) dy-4 are respectively set to 20 wt %, 12.5 wt %, 3 wt %, and 1 wt % in the experiment table. Besides, device II-4, II-7, II-8, and II-9 are also listed in the experiment table, wherein the combining ratio of the first host light-emitting layer 14 and the second host light-emitting layer 15 in device II-4, II-7, II-8, and II-9 are 3:1, 1:1, 1:3 and 1:-, respectively.

Figure 13:
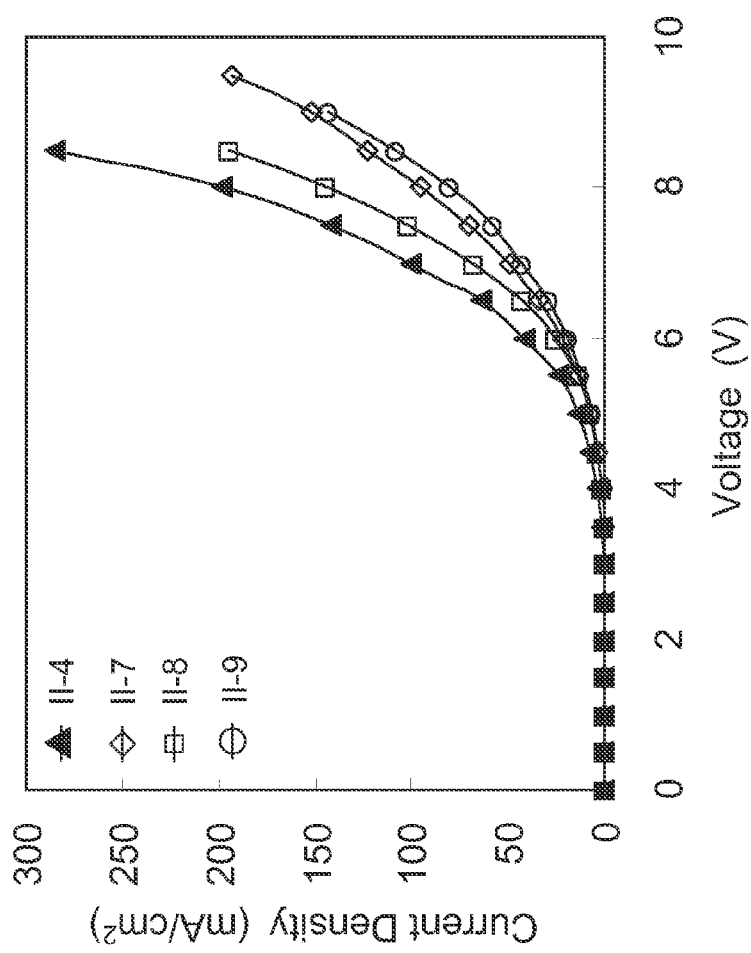
FIG. 13 is a curve plot of the current density of the second embodiment of the candlelight-like light organic light-emitting device.
Figure 14:
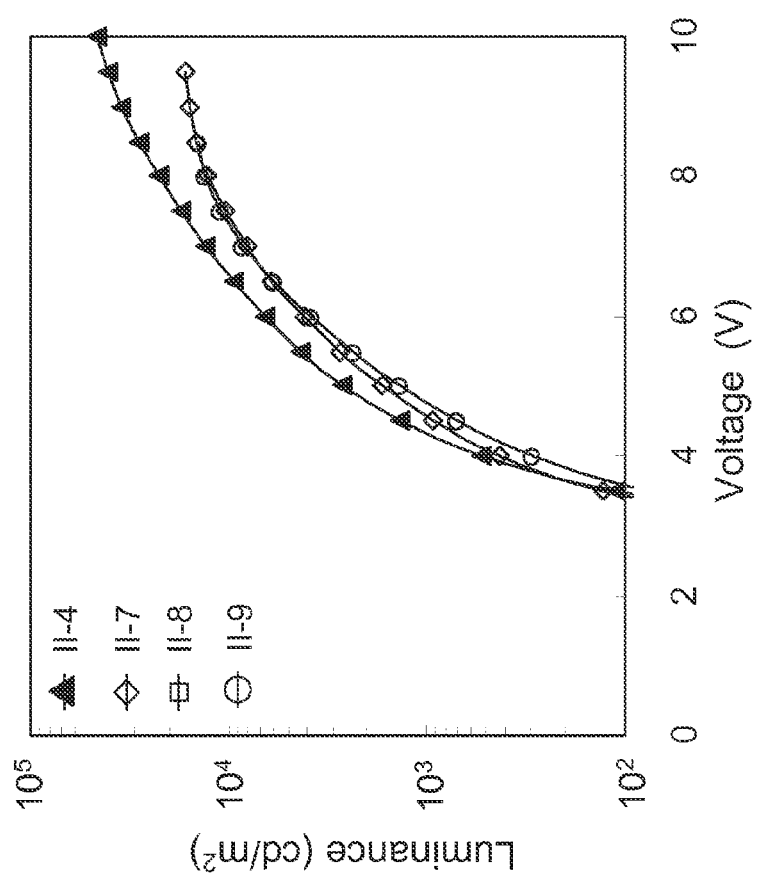
FIG. 14 is a curve plot of the luminance of the second embodiment of the candlelight-like light organic light-emitting device.
Figure 15:
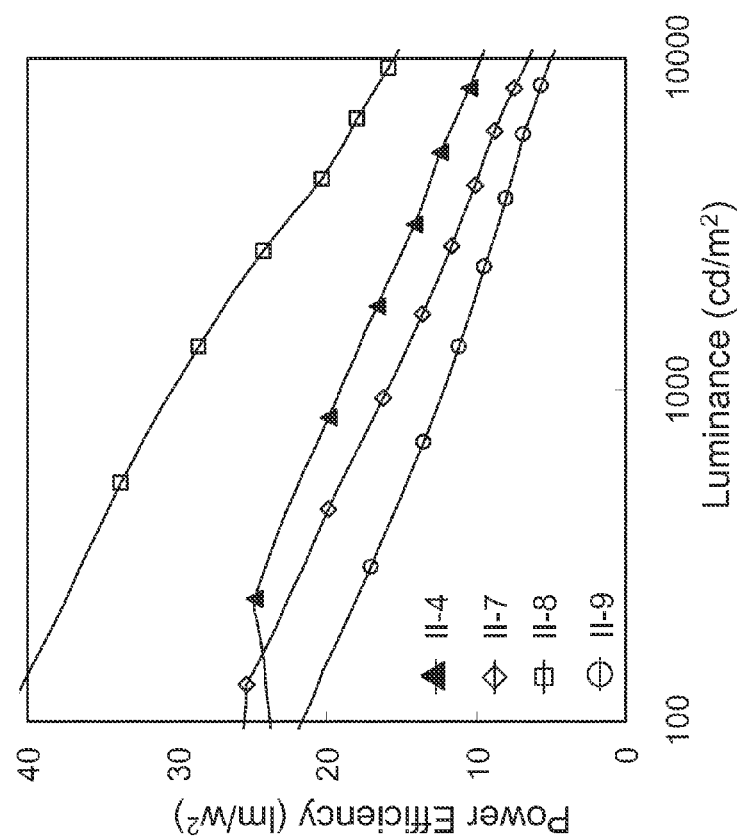
FIG. 15 is a curve plot of the power efficiency of the second embodiment of the candlelight-like light organic light-emitting device.

Referring to FIG. 12 again, and please simultaneously refer to FIG. 13, FIG. 14 and FIG. 15, which illustrate curve plots of the current density, the luminance and the power efficiency of the second embodiment of the candlelight-like light organic light-emitting device. As shown in FIG. 13, the data points of solid triangular, hollow diamond, hollow rectangular, and hollow circular respectively represent the current density of device II-4, II-7, II-8, and II-9, wherein the current density of device II-4 is greater than the current density of device II-7, II-8 and II-9. Moreover, as shown in FIG. 14, the luminance of device II-4 is also greater than the luminance of device II-7, II-8 and II-9. Furthermore, as shown in FIG. 15, the power efficiency of device II-4 and II-8 are greater than the power efficiency of device II-7 and II-9. In addition, device II-4 also performs higher color rendering index (CRI=93) and lower color temperature (CT=2150K) than device II-7, II-8 and II-9.

Thus, through the descriptions, the candlelight-like light organic light-emitting device of the present invention has been completely introduced and disclosed; Moreover, the practicability and the technology feature have also been proven by various experiment data. So that, in summary, the present invention has the following advantages:

In the present invention, a plurality of candlelight complementary color dyes are doped in the first host light-emitting layer and the second host light-emitting layer for making the first host light-emitting layer and the second host light-emitting layer respectively emit a first light and a second light, such that the first light and the second light are mixed to a candlelight-like light with high color rendering index and low color temperature; therefore the candlelight-like light is suitable for being a reading light or a bedside light, and can facilitate users to read by their eyes under a comfortable condition.

Moreover, by forming a combined light-emitting layer between the first host light-emitting layer and the second host light-emitting layer, the candlelight-like light organic light-emitting device would perform higher CRI and power efficiency.

The above description is made on embodiments of the present invention. However, the embodiments are not intended to limit scope of the present invention, and all equivalent implementations or alterations within the spirit of the present invention still fall within the scope of the present invention.

What is claimed is:

1. A candlelight-like light organic light-emitting device, comprising:
 a first conductive layer;
 a hole injection layer, being formed on the first conductive layer;
 a hole transport layer, being formed on the hole injection layer;
 a first host light-emitting layer, being formed on the hole transport layer;
 a second host light-emitting layer, being formed on the first host light-emitting layer;
 an electron transport layer, being formed on the second host light-emitting layer;
 an electron injection layer, being formed on the electron transport layer; and
 a second conductive layer, being formed on the electron injection layer;
 wherein a plurality of candlelight complementary color dyes are doped in the first host light-emitting layer and the second host light-emitting layer for making the first host light-emitting layer and the second host light-emitting layer respectively emit a first light and a second light, such that the first light and the second light are mixed to a candlelight-like light with high color rendering index and low color temperature.

2. The candlelight-like light organic light-emitting device of claim 1, wherein the plurality of candlelight complementary color dyes comprises:
 a first dye, being doped in the first host light-emitting layer;
 a second dye, being doped in the second host light-emitting layer;
 a third dye, being doped in the second host light-emitting layer; and
 a fourth dye, being doped in the second host light-emitting layer.

3. The candlelight-like light organic light-emitting device of claim 1, wherein the material of the hole injection layer is Poly-3,4-Ethylenedioxythiophene (PEDOT), the material of the hole transport layer being (1,1-bis{4-[di(p-tolyl)amino]-phenyl}cyclohexane) (TAPC), the material of the electron transport layer being 1,3,5-tris(N-phenylbenzimidazol-2-yl) benzene (TPBi), and the material of the electron injection layer being LiF.

4. The candlelight-like light organic light-emitting device of claim 1, wherein the material of the first dye is Iridium(III) bis(4,6-difluorophenylpyridinato)picolate (FIrpic), the material of the second dye is tris(2-phenylpyridine)iridium (Ir(ppy)$_3$), the material of the third dye is Iridium(III)bis(4-phenylthieno[3,2-c]pyridinato-N,C2') acetylacetonate (PO-01), and the material of the fourth dye is Bis(1-phenylisoquinoline) (acetylacetonate)iridium(III) (Ir(piq)$_2$ (acac)).

5. The candlelight-like light organic light-emitting device of claim 4, wherein the weight percentage (wt %) of the first dye in the first host light-emitting layer is 20 wt %.

6. The candlelight-like light organic light-emitting device of claim 4, wherein the weight percentage (wt %) of the second dye, third dye and fourth dye in the second host light-emitting layer are 12.5 wt %, 5 wt % and 1 wt %, respectively.

7. The candlelight-like light organic light-emitting device of claim 1, wherein the thickness ratio of the first host light-emitting layer and the second host light-emitting layer is ranged from 1:1 to 1:3.

8. The candlelight-like light organic light-emitting device of claim 1, wherein the thickness ratio of the first host light-emitting layer and the second host light-emitting layer is ranged from 1:1 to 3:1.

9. The candlelight-like light organic light-emitting device of claim 1, further comprising a carrier modulation layer, being formed between the first host light-emitting layer and the second host light-emitting layer.

10. The candlelight-like light organic light-emitting device of claim 9, wherein the combining ratio of the first host light-emitting layer and the second host light-emitting layer is 3:1.

* * * * *